US012702038B2

(12) United States Patent
Ma et al.

(10) Patent No.: US 12,702,038 B2
(45) Date of Patent: Aug. 4, 2026

(54) SYSTEM AND METHOD FOR FLUXLESS THERMOCOMPRESSION BONDING

(71) Applicant: ASMPT Singapore Pte. Ltd., Singapore (SG)

(72) Inventors: Zetao Ma, Hong Kong (CN); Ming Li, Hong Kong (CN); Chun Ho Fan, Hong Kong (CN); Kin Yik Hung, Hong Kong (CN); Siu Wing Lau, Hong Kong (CN)

(73) Assignee: ASMPT Singapore Pte. Ltd., Singapore (SG)

( * ) Notice: Subject to any disclaimer, the term of this patent is extended or adjusted under 35 U.S.C. 154(b) by 450 days.

(21) Appl. No.: 18/132,482

(22) Filed: Apr. 10, 2023

(65) Prior Publication Data
US 2024/0339430 A1    Oct. 10, 2024

(51) Int. Cl.
*H10W 72/00* (2026.01)
*H10P 72/00* (2026.01)
*H10W 80/00* (2026.01)

(52) U.S. Cl.
CPC ...... *H10W 72/0711* (2026.01); *H10W 72/072* (2026.01); *H10W 80/334* (2026.01);
(Continued)

(58) Field of Classification Search
CPC .......... H01L 24/75; H01L 2224/81013; H01L 2224/81022; H01L 2224/7501;
(Continued)

(56) References Cited

U.S. PATENT DOCUMENTS 8,449,712 B2 * 5/2013 Inamoto .................. H01L 24/81
228/205
2003/0164396 A1 * 9/2003 Suga ...................... B23K 1/206
257/E21.511
(Continued)

FOREIGN PATENT DOCUMENTS

CN        115706009 A      2/2023
JP      2006-080099 A      3/2006
(Continued)

OTHER PUBLICATIONS

KR Office Action mailed Jan. 3, 2025, issued in corresponding Korean Patent Application No. 10-2024-0040778 with its English translation.
(Continued)

*Primary Examiner* — David A Zarneke
(74) *Attorney, Agent, or Firm* — OSTROLENK FABER LLP

(57) ABSTRACT
A bonding system for bonding an electronic component to a base member includes a first container for forming a first inert environment where the base member is locatable during bonding of the electronic component. A first plasma cleaning device is located in the first container to clean the electronic component and/or the base member by removing metal oxides therefrom. A second plasma cleaning device is also provided to clean the electronic component by removing organic contaminants therefrom before the electronic component is conveyed into the first container. A bond head is movably installed in the first container to bond the electronic component to the base member after the electronic component and/or the base member have been cleaned by the first plasma cleaning device.

19 Claims, 6 Drawing Sheets

(52) U.S. Cl.
CPC ... *H10P 72/0428* (2026.01); *H10W 72/01271* (2026.01); *H10W 72/07118* (2026.01); *H10W 72/07125* (2026.01); *H10W 72/07173* (2026.01); *H10W 72/07232* (2026.01)

(58) Field of Classification Search
CPC ..... H10W 72/01271; H10W 72/07118; H10W 72/07232; H10W 80/334
See application file for complete search history.

(56) References Cited

U.S. PATENT DOCUMENTS

| | | | | |
|---|---|---|---|---|
| 2004/0169020 A1* | 9/2004 | Yamauchi | ........... | H01L 21/4864 |
| | | | | 219/121.46 |
| 2019/0027462 A1 | 1/2019 | Sugaya et al. | | |

FOREIGN PATENT DOCUMENTS

| | | | | | |
|---|---|---|---|---|---|
| JP | 4669600 | B2 | 4/2011 | | |
| JP | 2013-093370 | A | 5/2013 | | |
| KR | 10-0669398 | B1 | 1/2007 | | |
| KR | 10-2016-0138916 | A | 12/2016 | | |
| WO | 01041963 | A2 † | 6/2001 | | |
| WO | WO-0141963 | A2 * | 6/2001 | ....... | H01L 21/67144 |
| WO | WO 2012/026334 | A1 | 3/2012 | | |

OTHER PUBLICATIONS

Extended European Search Report dated Oct. 24, 2024, issued in corresponding European Patent Application No. 24163399.9.
JP Third-Party Observations dated Dec. 20, 2024, issued in Japanese Patent Application No. 2024-062660 with its English translation.

\* cited by examiner
† cited by third party

SYSTEM AND METHOD FOR FLUXLESS THERMOCOMPRESSION BONDING

FIELD OF THE INVENTION

The invention relates to thermocompression bonding, and in particular to a fluxless thermocompression bonding system and method which can actively remove impurities, such as organic containments and metal oxides, on an electronic component and a base member on which the electronic component is to be bonded.

BACKGROUND

Thermocompression bonding (or "TCB") is one process by which a flip-chip bonding process may be conducted. During the bonding process, a die from the silicon wafer is transferred to a bond head with bumps on the die facing down. The die carried by the bond head is then placed onto a bonding location of the substrate. A compressive force is then applied onto the die to press it against the substrate to ensure good contact between the die and the substrate. As is well known in the art, impurities on bonding surfaces of the die and the substrate may prevent good contact therebetween which may significantly affect the performance of a final bonded package. The impurities may include, without limitation, organic contaminants covering the bonding surfaces of the die and the substrate, and metal oxides arising from oxidation of the bonding materials and bonding surfaces before or during the TCB process.

In one prior art TCB process, liquid flux may be applied to the bonding surfaces of the die and the substrate to remove metal oxides thereon before bonding. After the die and the substrate are bonded together, a deflux process is conducted to remove the flux residue on the final bonded package. However, the application of the flux and the deflux process will lead to a significant increase in the costs of the bonding process. Moreover, metal oxides may be further generated after the above-described oxide removal process, before or during the bonding process. In addition, as the oxide removal process is not suitable for removing organic contaminants, the quality of the joint between the die and substrate may still be affected if there are organic contaminants present.

It would therefore be beneficial to effectively and substantially remove both metal oxides and organic contaminants on the die and the substrate before the die is bonded onto the substrate, and to prevent metal oxides from being produced before or during the bonding process.

SUMMARY OF THE INVENTION

It is thus an object of this invention to seek to provide a fluxless thermocompression bonding system and method for effectively removing or reducing both metal oxides and organic contaminants present on an electronic component and a base member before the electronic component is bonded to the base member and for preventing metal oxides from being produced before or during the bonding process. Doing so would aid in avoiding performance degradation of the final bonded package caused by such impurities that might be present on the electronic component and the base member.

According to a first aspect of the invention, there is provided a bonding system for bonding an electronic component such as a die or chip, to a base member such as a substrate. The system includes a first container for forming a first inert gas environment where the base member is locatable during bonding of the electronic component, a first plasma cleaning device operative to clean the electronic component and/or the base member by removing metal oxides therefrom, the first plasma cleaning device being located in the first container, a second plasma cleaning device operative to clean the electronic component by removing organic contaminants therefrom before the electronic component is transferred to the first container, and a bond head movably installed in the first container, the bond head being operative to bond the electronic component to the base member after the electronic component and/or the base member have been cleaned by the first plasma cleaning device.

With the above bonding system, a first cleaning process can first be conducted to remove organic contaminants from the electronic component with the second plasma cleaning device and a second cleaning process for removing metal oxides on the electronic component is then performed with the first plasma cleaning device after the electronic component is conveyed into the first container. At the same time, the first plasma cleaning device may also be used to clean the base member located in the first container before the electronic component is bonded to the base member. Hence, both organic contaminants on the electronic component and metal oxides present on the electronic component and the base member can be effectively removed before the bonding process. Further, since an inert gas environment is formed in the first container, metal oxides will not form on the electronic component and base member after the second cleaning process and during the subsequent bonding process in the first container. Thus, performance degradation of the final bonded package caused by impurities present on the electronic component and base member may be effectively avoided. The quality of the joint between the electronic component and the base member can thereby be greatly improved.

The first plasma cleaning device may include a first plasma head that is arranged and operative to clean the electronic component and a second plasma head that is arranged and operative to clean the base member. In one embodiment, the first plasma cleaning device may be an integrally formed single-piece device, i.e., a dual-head plasma cleaning device including the first plasma head and the second plasma head. This is a space-saving arrangement, which also can facilitate simultaneous cleaning of the electronic component and the base member. Alternatively, in another embodiment, the first and second plasma heads may be two separate devices that are independently operated to clean the electronic component and base member separately.

At least one of the first and second plasma heads may be attached to a motion table in the first container so as to be movable to a cleaning position in the first container to clean the electronic component and/or the base member. The first and second plasma heads may be attached to a common motion table or to different motion tables. The first plasma head may be movable to a first cleaning position where the first plasma head is aligned with the electronic component which may be held by the bond head or other holding device so as to clean the electronic component with plasma discharged from the first plasma head. The second plasma head may be movable to a second cleaning position where the second plasma head is aligned with the base member located in the first container so as to clean the base member with plasma discharged from the second plasma head.

To provide a more compact bonding system, the bond head of the bonding system may be further configured to pick up the electronic component and to hold the electronic component while the first plasma head is cleaning the electronic component. With this arrangement, no additional holding device is needed to hold the electronic component in the first container during the cleaning of the electronic component, so as to maintain the compactness of the first container. Further, both the first and second plasma heads may be attached to a common motion table and may move together with the common motion table. Preferably, the first and second plasma heads may be arranged to be positionable at the first and second cleaning positions at the same time such that when the first plasma head is moved to the first cleaning position to clean the electronic component with plasma, the second plasma head is simultaneously moved to the second cleaning position to clean the base member with plasma. For example, the first and second plasma heads may be arranged directly opposite to each other such that when a first discharging end of the first second plasma head is positioned facing the electronic component held by the bond head, a second discharging end of the second plasma head is positioned facing the base member located in the first container.

Alternatively, the first plasma head may be fixedly mounted at a first cleaning position in the first container for cleaning the electronic component. Accordingly, the bonding system may further include a holding device configured to hold the electronic component when the first plasma head is cleaning the electronic component. The holding device may be positioned to be aligned with the first plasma head in the first container such that the first plasma head is operative to clean the electronic component held by the holding device at the first cleaning position. A heating member may be coupled to the holding device to heat the electronic component during the cleaning process. This helps to accelerate the cleaning process and improve the efficiency of the first plasma head. The second plasma head may also be fixedly mounted at a second cleaning position in the first container for cleaning the base member.

The bonding system may further include a transfer system configured to transfer the electronic component that has been cleaned by the second plasma cleaning device to the first container and to position the electronic component inside the first container.

In order to improve the performance of the second plasma cleaning device, the bonding system may further include a second container for forming a second inert gas environment, wherein the second plasma cleaning device is located in the second container for cleaning the electronic component when the electronic component is conveyed to the second container.

The first container and the second container may be in communication with each other through a transport passage for allowing the electronic component that has been cleaned by the second plasma cleaning device to be transferred from the second container to the first container through the passport passage. A first inert gas diffuser may be installed on the transport passage to form a first fluid curtain in the transport passage for impeding fluid communication of gases between the first and second containers.

The second container may further include an input passage for conveying the electronic component into the second container through the input passage. To impede fluid communication of gases between the second container and an ambient environment outside the second container, a second inert gas diffuser may be installed on the input passage to form a second fluid curtain in the input passage.

The bonding system may further include an inert gas sensor located in the first container for detecting a concentration of the first inert gas environment in the first container. Preferably, the inert gas sensor may be installed on an internal wall inside an internal chamber in the first container, the bond head being movably installed in the internal chamber.

The bonding system may further include a hydrogen sensor located in the first container for detecting a concentration of hydrogen in the first container and/or an ozone sensor located on the second container for detecting leakage of ozone from the second container.

According to a second aspect of the invention, there is provided a bonding method for bonding an electronic component to a base member using a bonding system including a bond head, a first plasma cleaning device and a second plasma cleaning device, the first plasma cleaning device being located in a first inert gas environment formed in a first container. The method includes: cleaning the electronic component by removing organic contaminants therefrom with the second plasma cleaning device, conveying the electronic component that has been cleaned by the second plasma cleaning device to the first container, cleaning the electronic component and/or the base member located in the first container by removing metal oxides therefrom with the first plasma cleaning device, and bonding the electronic component to the base member with the bond head of the bonding system.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

DETAILED DESCRIPTION

Before discussing the embodiments in any more detail, an overview will first be provided. Some embodiments provide an arrangement where a bond head and a first plasma cleaning device are mounted in a first inert environment. The bond head is configured for bonding an electronic component to a base member, and the first plasma cleaning device is configured for cleaning the electronic component and/or the base member by removing metal oxides therefrom before bonding. As such, metal oxides on the electronic component and/or the base member can be effectively removed before bonding. Also, the first inert environment can effectively prevent metal oxides from being produced after the removal process and during the bonding process. Further, a second plasma cleaning device for cleaning the electronic component by removing organic contaminants therefrom may be also provided before the electronic component is conveyed into the first inert environment. The first plasma cleaning device may be movably or fixedly mounted in the first inert environment depending on the arrangement of the bonding system in the first inert environment. To accelerate the removal process of metal oxides, the electronic component and/or the base member may be heated by a heating member during the removal process.

Figure 1A:
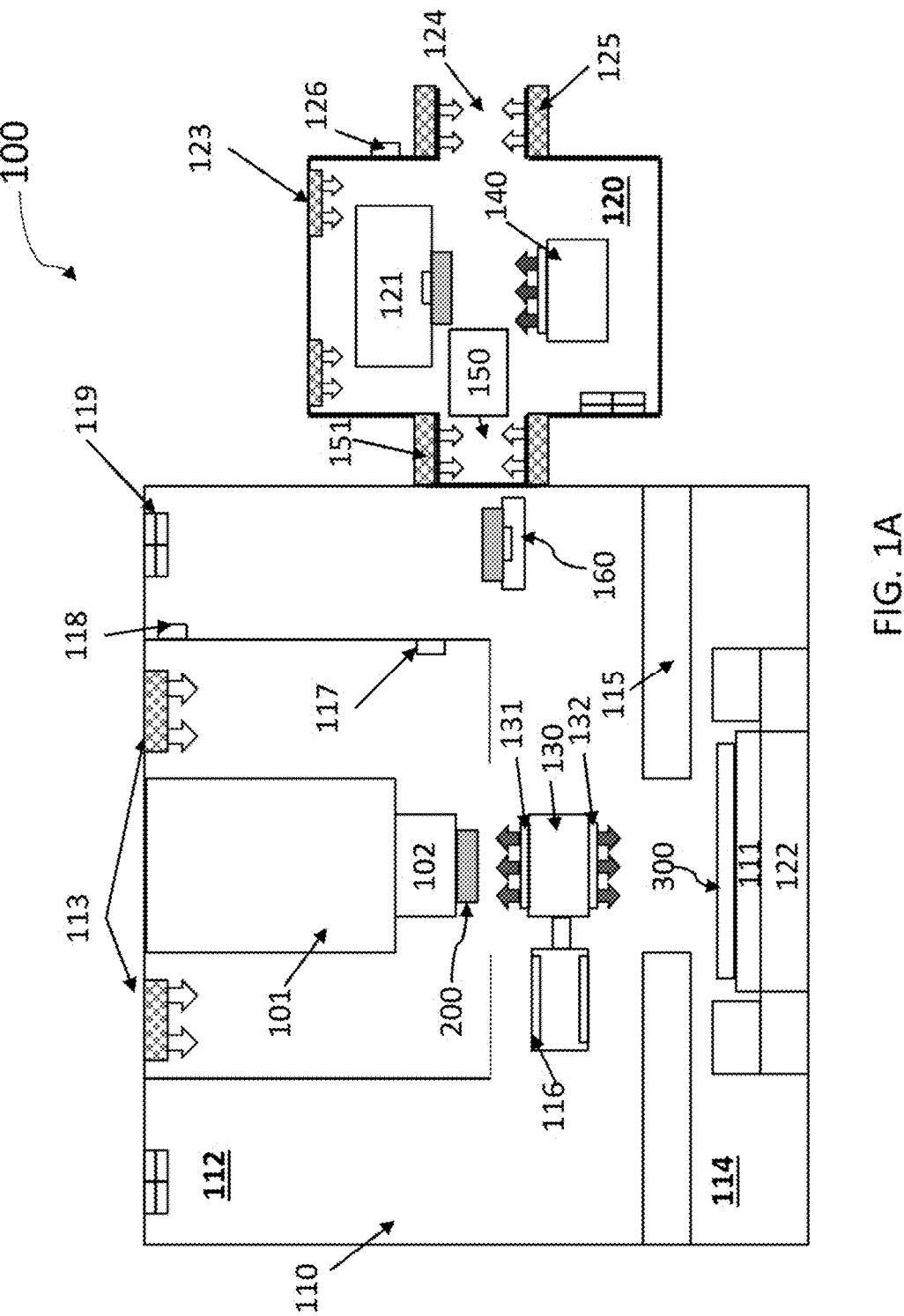
FIG. 1A is a schematic side view of a thermocompression bonding system for bonding a die to a substrate according to a first embodiment of the invention.

FIG. 1A is a schematic side view of a thermocompression bonding system 100 for bonding a die 200 to a substrate 300 according to a first embodiment of the invention. The bonding system 100 includes a first or main container 110 in which the first inert gas environment is formed, a first plasma cleaning device 130 movably mounted in the main container 110 for removing metal oxides from the die 200 and the substrate 300, a second or secondary container 120, and a second plasma cleaning device 140 mounted in the secondary container 120 for removing organic contaminants from the die 200.

Referring to FIG. 1A, the main container 110 includes an upper internal chamber 112 for holding a bond head 101 and a lower internal chamber 114 for holding a bond stage 122 on which the substrate 300 is locatable. The upper internal chamber 112 includes a bottom opening configured to allow the bond head 101 to move towards or away from the substrate 300. The lower internal chamber 114 may include a top plate 115 with an opening that is substantially aligned to the bottom opening of the upper internal chamber 112 so that the bond head 101 is operative to move down till the die 200 contacts the substrate 300 during the bonding process. The top plate 115 may further include a cooling plate.

The bonding system 100 may further include at least one first inert gas diffuser 113 installed on the main container 110 for forming the first inert environment in the main container 110. The first inert gas may include nitrogen and/or another inert gas, e.g., helium, and argon. Each first inert gas diffuser 113 is configured for introducing the first inert gas into the main container 110. In this embodiment, there are two first inert gas diffusers 113 mounted to the top surface of the upper internal chamber 112. Alternatively, the first inert gas diffuser 113 may be mounted outside the main container 110. The main container 110 may include at least one first inert gas inlet fluidly connected to the first inert gas diffuser 113 for allowing the first inert gas from the first inert gas diffuser 113 to enter into the main container 110 through the first inert gas inlet. The main container 110 may further include at least one exhaust vent 119 for allowing the air inside the main container 110 to be discharged when needed, for example when the concentration of the inert gas in the main container 110 needs to be adjusted.

In this embodiment, the first plasma cleaning device 130 has dual heads including a first plasma head 131 and a second plasma head 132. The first plasma cleaning device 130 is attached to a motion table 116 with the first and second plasma heads 131, 132 being arranged directly opposite to each other. Specifically, when the first plasma cleaning device 130 is moved by the motion table 116 along a horizontal direction, e.g., a direction along the X-axis or Y-axis of a Cartesian coordinate system, the first plasma head 131 is movable to a first cleaning position where a first discharging end of the first plasma head 131 is positionable to face the die 200 held by the bond head 101 such that the die 200 is cleaned by the first plasma head 131 with plasma discharged from the first discharging end, and the second plasma head 132 is movable to a second cleaning position where a second discharging end of the second plasma head 132 is positionable to face the substrate 300 located on the bond stage 122 such that the substrate 300 is cleaned by the second plasma head 132 with plasma discharged from the second discharging end. With this arrangement, the first plasma cleaning device 130 may be moved to the cleaning position of the first plasma cleaning device 130 between the die 200 held by the bond head 101 and the substrate 300 on the bond stage 122 such that the first and second plasma heads 131, 132 are operative to clean the die 200 and substrate 300 simultaneously. The cleaning position of the first plasma cleaning device 130 refers to that the first plasma head 131 is located at the first cleaning position and the second plasma head 132 is located at the second cleaning position.

The first plasma head 131 may be a nozzle-type plasma head which includes at least one nozzle for discharging plasma towards the die 200 held by the bond head 101 to remove metal oxides on the die 200. The second plasma head 132 may be a point-type plasma head which includes at least one nozzle for discharging plasma towards the substrate 300 located on the bond stage 122. Alternatively, the first and second plasma heads 131, 132 may comprise other types of plasma heads, e.g., line-type plasma heads. It should be appreciated by a person skilled in the art that, in other embodiments, the two plasma heads 131, 132 may be separate devices and attached to the same or different motion tables as long as the two plasma heads 131, 132 are operative to effectively remove metal oxides on the die 200 and the substrate 300 respectively.

The first plasma cleaning device 130 may use hydrogen as an active gas to remove metal oxides on both the die 200 and the substrate 300. Accordingly, the gas in the main container 110 includes a mixture of the active hydrogen gas used by the first plasma cleaning device 130 and the inert gas introduced into the main container 110, e.g., nitrogen, helium, or argon.

To efficiently and effectively remove metal oxides from the die 200 with the first plasma head 131, the bond head 101 may further include a heating element 102 for heating the die 200 when removing metal oxides from the die 200 with the first plasma head 131. Similarly, the bond stage 122 may further include a heating member 111 for heating the substrate 300 when removing metal oxides therefrom with the second plasma head 132 in order to efficiently and effectively remove metal oxides from the substrate 300.

The secondary container 120 is configured to form a second inert gas environment so as to improve the performance of the second plasma cleaning device 140 mounted in the secondary container 120. The bonding system 100 may further include at least one second inert gas diffuser 123 for generating and providing the second inert gas into the secondary container 120 to form the second inert gas environment. The second inert gas diffuser 123 may either be installed on an internal wall of the secondary container 120 or outside the secondary container 120. If the second inert gas diffuser 123 is mounted outside the secondary container 120, the secondary container 120 may further include at least one second inert gas inlet fluidly connected to the second inert gas diffuser 123 to allow the second inert gas to enter into the secondary container 120. The second inert gas may include nitrogen or any other inert gas. In this embodiment, two second inert gas diffusers 123 are mounted on a top internal surface of the secondary container 120. The secondary container 120 further includes an input passage 124 for allowing the die 200 to be transported into the secondary container 120. In order to prevent or at least reduce air communication between the secondary container 120 and the ambient environment outside the secondary container 120, at least one third inert gas diffuser 125 may be installed on the input passage 124 to form a barrier such as a fluid curtain in the input passage 124.

The second plasma cleaning device 140 mounted in the secondary container 120 is configured to remove organic contaminants from the die 200 in the secondary container 120 before the die 200 is transferred to the main container 110. In this embodiment, the bonding system 100 may further include a die holding device or arm 121 configured to hold the die 200 with a bump side of the die 200 facing the second plasma cleaning device 140. In this embodiment, the die holding device 121 is mounted in an upper portion of the secondary container 120. The second plasma cleaning device 140 is located in a lower portion of the secondary container 120 and aligned with the die holding device 121 such that the die 200 held by the die holding device 121 can be cleaned by the second plasma cleaning device 140. With this arrangement, a discharging end of the second plasma cleaning device 140 faces the bump side of the die 200 such that organic contaminants can be removed from the bump side of the die 200 with plasma discharged from the discharging end of the second plasma cleaning device 140. The second plasma cleaning device 140 may use oxygen as an active gas to remove organic contaminants on the die 200. Accordingly, the gas in the secondary container 120 includes a mixture of the active gas oxygen and the second inert gas entered into the secondary container 120. Organic contaminants on the die 200 may include but not be limited to organic residue on surfaces of interconnects of the die 200, such as solder bumps and metal pillars of the die 200. Typically, the metal pillars may include copper, nickel or gold pillars. It should be noted that the arrangement of the second plasma cleaning device 140 and the die holding device 121 is only for illustration purposes, and does not limit the scope of the invention. In other embodiments, these devices may be arranged in different ways, e.g., the die holding device 121 may be located in the lower portion of the secondary container 120 and the second plasma cleaning device 140 may be mounted in the upper portion of the secondary container 120 and aligned with the die holding device 121 In certain embodiments, the die holding device 121 or the second plasma cleaning device 140 may be movably installed in the secondary container 120. This allows the die 200 held by the die holding device 121 to be aligned with the second plasma cleaning device 140 prior to the activation of the second plasma cleaning device 140 for cleaning purposes. For instance, the die holding device 121 or the second plasma cleaning device 140 may be mounted on a motion table in some cases.

The bonding system 100 may further include a transport passage 150 configured to connect the main container 110 and the secondary container 120. The transport passage 150 is arranged to allow the die 200 to be transported from the secondary container 120 to the main container 110 by a transfer system 160. In order to avoid or reduce gas communication between the first and second chambers, at least one further inert gas diffuser 151 may be installed on the transport passage 150 to form a fluid curtain along the transport passage 150. The transfer system 160 may include a movable die transfer arm configured for transferring the die 200 from the secondary container 120 to a predetermined location in the main container 110 where the bond head 101 is operative to pick up the die 200 from the transfer system 160. When the die 200 is received by the transfer system 160 from the die holding device 121, the bump side of the die 200 is in contact with the transfer system 160 such that when the bond head 101 picks up the die 200 from the transfer system 160, the bump side of the die 200 faces downward again.

The bonding system 100 may further include an inert gas sensor 117 located in the upper internal chamber 112 for detecting a concentration or a parts-per-million (ppm) level of the first inert gas environment in the main container 110. The inert gas sensor 117 may be installed on an internal surface of the upper internal chamber 112. Referring to FIG. 1, the inert gas sensor 117 may be preferably located at a position near a bottom opening of the upper internal chamber 112. The exhaust vent 119 of the main container 110 may be used to discharge excess inert gas from the main container 110 if the inert gas sensor 117 detects that the ppm level of the first inert gas environment exceeds a predetermined level.

A hydrogen sensor 118 may be further installed in the first container 110 for detecting a concentration of hydrogen in the main container 110, in order to make sure the concentration of the active hydrogen gas does not exceed a predetermined safety level. Additionally, the bonding system 100 may further include an ozone sensor 126 located on the secondary container 120 for detecting any leakage of ozone ($O_3$) from the secondary container 120.

Figure 1B:
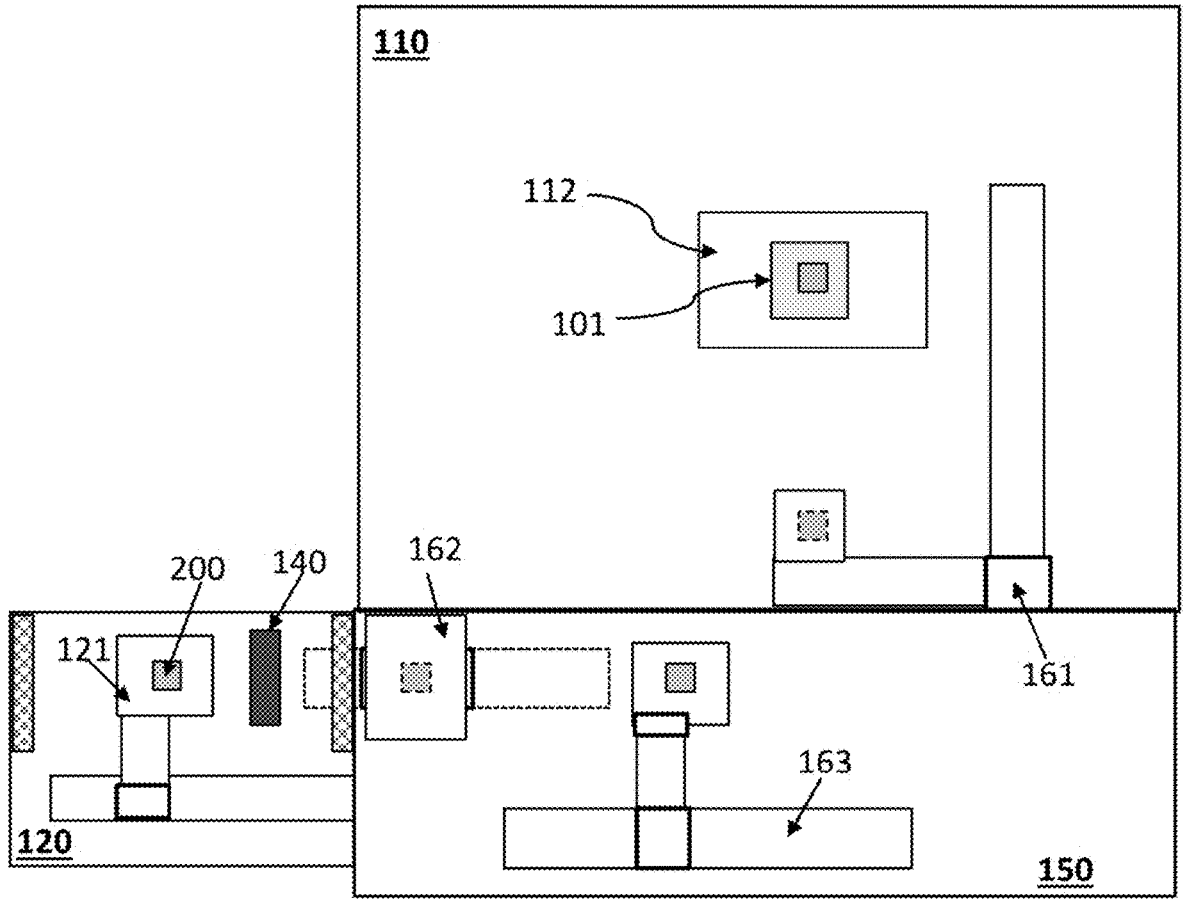
FIG. 1B is a schematic plan view of a transfer system of the bonding system according to the first embodiment of the invention.

FIG. 1B is a schematic plan view of a transfer system 160 of the bonding system 100 according to the first embodiment of the invention. As shown in FIG. 1B, the transfer system 160 may include a die transfer arm (DTA) 161, a die feeder 162, and a die pick arm (DPA) 163. In this embodiment, the die holding device 121 may be mounted on a motion table, which allows it to transfer the die 200 to a position that is directly aligned with the second plasma cleaning device 140. once the second plasma cleaning device 140 has cleaned the die 200, the die holding device 121 is operative to transfer the cleaned die 200 to the die feeder 162. The die feeder 162 is configured to receive the die 200 that has been cleaned by the second plasma cleaning device 140 from the die holding device 121. The die 200 is placed on the die feeder 162 with its bump/front side being in contact with the die feeder 162. Then the die pick arm (DPA) 163 is operated to pick up the die 200 from the die feeder 162 and transfer the die 200 to a pad of the die transfer arm (DTA) 161 with the bump side of the die 200 being in contact with the pad. The DTA 161 is operative to move the die 200 to a predetermined position such that the bond head 101 is operative to pick up the die 200 from the DTA 161. The bond head 101 is then operated to pick up the die 200 from the DTA 161 with the bump side of the die 200 facing downward before the process of removing metal oxides on the die 200 using the first plasma head 131 of the first cleaning device 130.

Figure 2:
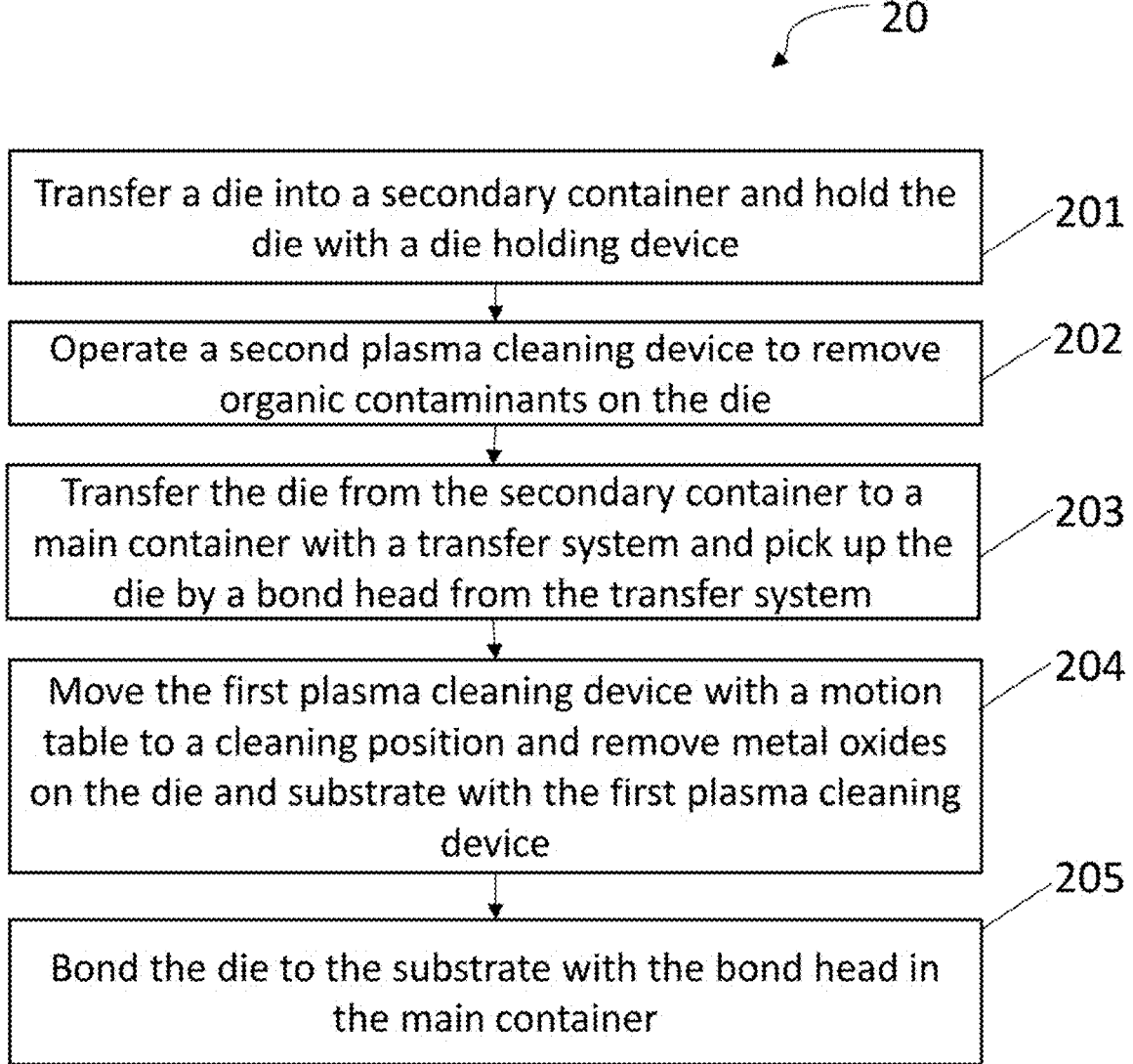
FIG. 2 is a flowchart illustrating a thermocompression bonding method for bonding the die to the substrate with the bonding system according to the first embodiment of the invention.

FIG. 2 is a flowchart illustrating a thermocompression bonding method 20 for bonding the die 200 to the substrate 300 with the bonding system 100 according to the first embodiment of the invention.

At Step 201, the die 200 is transferred into the secondary container 120 and held by a die holding device 121 with a bump side of the die 200 facing downward such that the bump side of the die 200 can be cleaned by the second plasma cleaning device 140 located in the secondary container 120 to remove organic contaminants from the bump side of the die 200.

Referring to FIG. 1B, the die 200 is held by the die holding device 121, which enables the second plasma cleaning device 140 to discharge plasma towards the bump side of the die 200 and remove organic contaminants from the die 200. Alternatively, the die holding device 121 may be replaced with a die support stage, on which the die 200 can be placed. In this setup, the second plasma cleaning device 140 may be positioned directly above the die support stage and configured to discharge plasma downwardly towards the bump side of the die 200. Furthermore, the die holding device 121 may be installed on a motion table, allowing it to transfer the die 200 to a position that is directly aligned with the second plasma cleaning device 140 before the cleaning process begins.

At Step 202, the second plasma cleaning device 140 is operated to remove organic contaminants from the die 200 in the secondary container 120. The active gas used by the second plasma cleaning device 140 includes oxygen.

At Step 203, the die 200 is transferred by the transfer system 160 from the secondary container 120 to the main container 110 and is picked up by the bond head 101 from the transfer system 160.

Specifically, in this embodiment, referring to FIG. 1B, the transfer system 160 may include the DTA 161, the die feeder 162, and the DPA 163. After the die 200 has been cleaned by the second plasma cleaning device 140, the die holding device 121 may be moved further to transfer the die 200 to the die feeder 162. The die 200 may be placed on the die feeder 162 with its bump side being in contact with the die feeder 162. Then the die 200 is picked up by the DPA 163 from the die feeder 162. The DPA 163 is operative to transfer the die 200 to a pad of the DTA 161 with the bump side of the die 200 being in contact with the pad. Then, the die 200 is moved to a predetermined position directly below the bond head 101 by the DTA 161 such that the bond head 101 is operated to pick up the die 200 from the DTA 161 with the bump side of the die 200 facing downward.

At Step 204, the first plasma cleaning device 130 is moved by the motion table 116 to a cleaning position and is operated to remove metal oxides from the die 200 and the substrate 300 simultaneously. The cleaning position may be arranged to be aligned with the die 200 and the substrate 300 such that the first plasma head 131 is operative to clean the die 200 and the second plasma head 132 is operative to clean the substrate 300.

At Step 205, the bond head 101 bonds the die 200 to the substrate 300 in the main container 110.

In the first embodiment, the first plasma cleaning device 130 is movable such that the process of cleaning metal oxides can be conducted when the die 200 is held by the bond head 101. Alternatively, in other embodiments, the first plasma cleaning device 130 or at least one plasma head of the first plasma cleaning device 130 may be fixedly installed in the main container 110 and the die 200 may be movable to a predetermined position for removing metal oxides with the first plasma head 131 of the first plasma cleaning device 130.

Figure 3A:
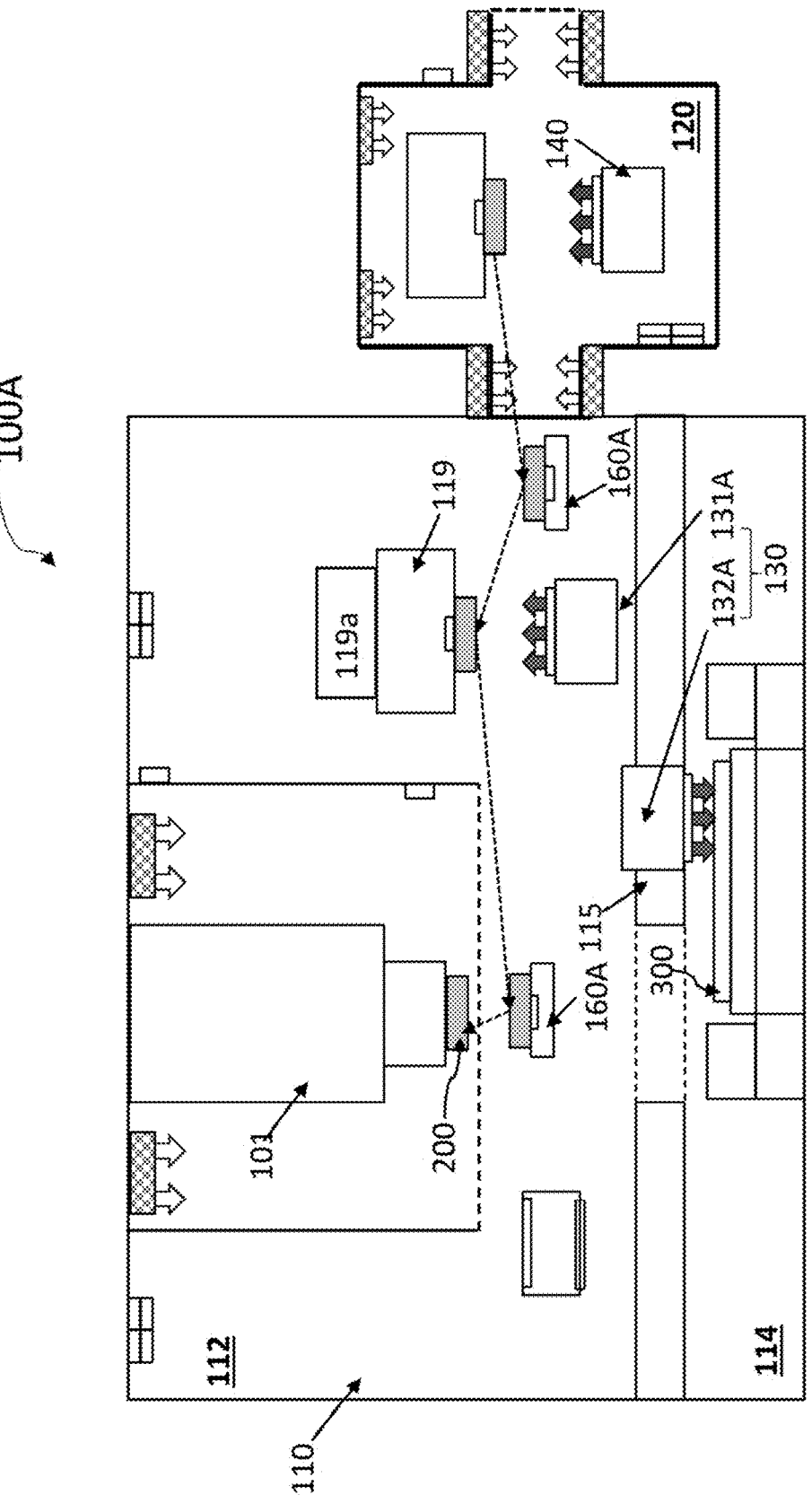
FIG. 3A is a schematic side view of a thermocompression bonding system for bonding a die to a substrate according to a second embodiment of the invention.

FIG. 3A is a schematic section view of a thermocompression bonding system 100A for bonding the die 200 to the substrate 300 according to a second embodiment of the invention. Similar to the bonding system 100, the bonding system 100A includes a main container 110, a secondary container 120, a first plasma cleaning device 130 mounted in the main container 110 and a second plasma cleaning device

140 mounted in the secondary container 120. The main structural differences between the bonding system 100A and the bonding system 100 include the first plasma cleaning device 130 being arranged in a different way and an additional die holding device 119 being provided in the main container 110. Furthermore, the bonding system 100A also includes a transfer system 160A for transferring the die 200 from the secondary container 120 to the main container 110 and positioning the die 200 in the main container 110. The functions of the transfer system 160A are slightly different from the transfer system 160 in the first embodiment.

Referring to FIG. 3A, in this embodiment, the first plasma cleaning device 130 includes a first plasma head 131A and a second plasma head 132A which are fixedly mounted in the main container 110. The die holding device 119 is positioned to be aligned with the first plasma head 131A such that the die 200 held by the die holding device 119 can be cleaned by the first plasma head 131A.

The transfer system 160A is configured for transferring the die 200 from the secondary container 120 to the main container 110 and positioning the die 200 at a first predetermined position. This position allows the die holding device 119 to pick up the die 200 from the transfer system 160A before the first plasma head 131A is operated to remove metal oxides from the die 200. The die holding device 119 may be installed on a motion table and moved to the first predetermined position to pick up the die 200 from the transfer system 160A. After the die holding device 119 has picked up the die 200, the first plasma head 113A can be used to clean the die 200. Once the cleaning process is complete, the die holding device 119 is operative to return the die 200 to the transfer system 160A. The first predetermined position may be directly below the die holding device 119 or directly above the first plasma head 131A.

The die holding device 119 may further include a heating member 119a configured to heat the die 200 when the die 200 is cleaned by the first plasma head 131A. The heating member 119a may be further used for activating the surface of the die 200. The second plasma head 132A may be fixedly mounted in the lower internal chamber 114 of the main container 110 for removing metal oxides from the substrate 300 before the die 200 is bonded to the substrate 300. Preferably, the second plasma head 132A may be coupled to the top plate 115 of the lower internal chamber 114, such as the cooling plate of the top plate 115.

After the die 200 is cleaned by the first plasma head 131A, the die 200 is further transferred by the transfer system 160A to a second predetermined position so that the bond head 101 can then pick up the die 200 from the transfer system 160A and bond the die 200 to the substrate 300. Preferably, the second predetermined position is directly below the bond head 101. Unlike the first embodiment, the bond head 101 in the second embodiment is not used for holding the die 200 during the process of removing metal oxides from the die 200. The dashed line arrows indicate a possible transfer path of the die 200 during the whole process.

Figure 3B:
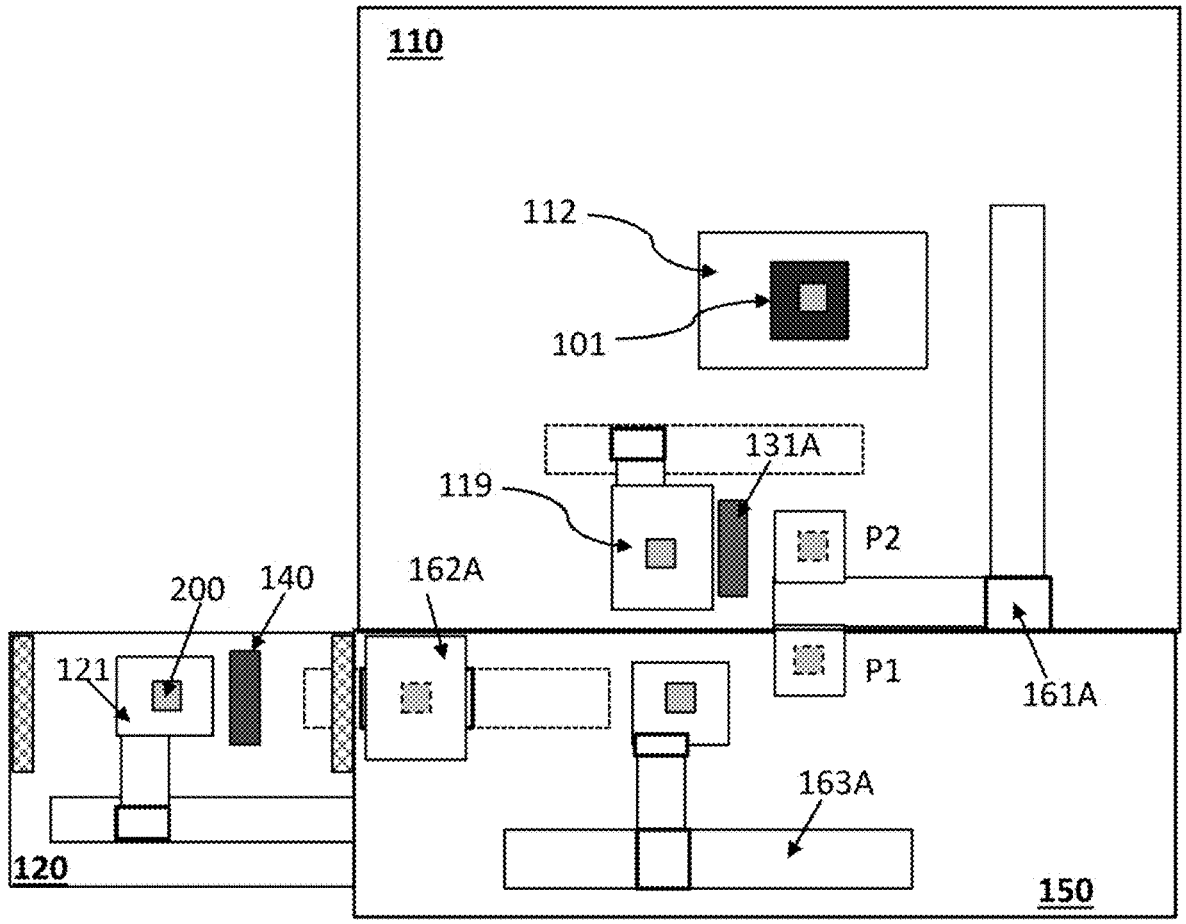
FIG. 3B is a schematic plan view of a transfer system of the bonding system according to the second embodiment of the invention.

FIG. 3B is a schematic plan view of a transfer system 160A of the bonding system 100A according to the second embodiment of the invention. Referring to FIG. 3B, the transfer system 160A may include a die feeder 162A, a DPA 163A and a DTA 161A. The die feeder 162A is configured to receive the die 200 with the die's bump side in contact with the die feeder 162A after the die 200 is cleaned by the second plasma cleaning device 140. The DPA 163A is operative to pick up the die 200 from the die feeder 162A and transfer the die 200 to a first pad P1 of the DTA 161A with the bump side of the die 200A in contact with the first pad P1. The DTA 161A is operative to move the die 200A to a first predetermined position so that the die holding device 119 can be moved to the first predetermined position to pick up the die 200 from the first pad P1 of the DTA 161A with the bump side of the die 200A facing downward. The die holding device 119 is then moved to a position directly aligned with the first plasma head 131A. After the die 200 is cleaned by the first plasma head 131A, the die holding device 119 moves to place the die 200 on the second pad P2 of the DTA 161A. The DTA 161A is then operative to transfer the die 200 to the second predetermined position below the bond head 101 such that the die 200 can be picked up by the bond head 101 from the DTA 161A.

Figure 4:
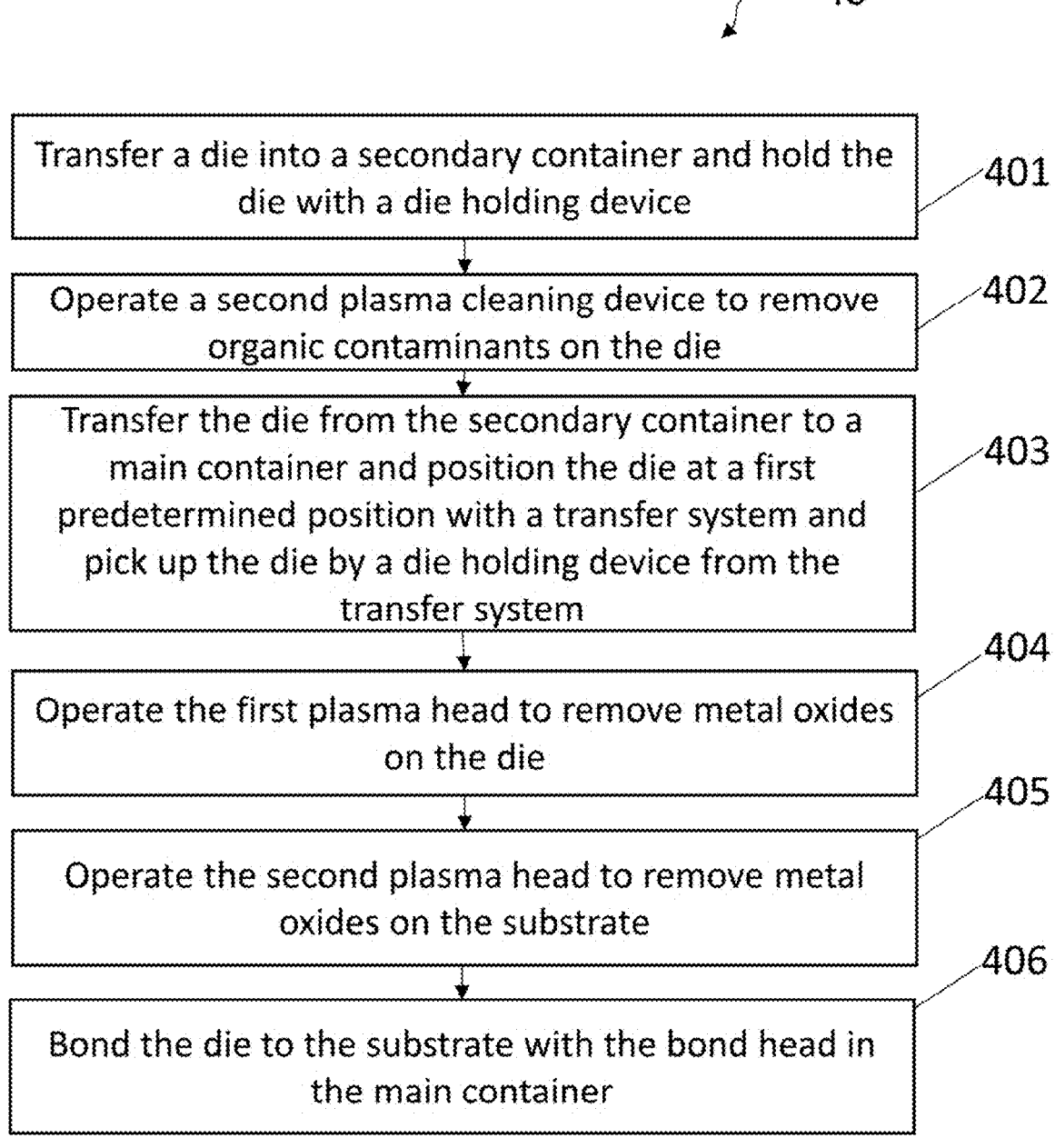
FIG. 4 is a flowchart illustrating a thermocompression bonding method for bonding the die to the substrate with the bonding system according to the second embodiment of the invention In the drawings, like parts are denoted by like reference numerals.

FIG. 4 is a flowchart illustrating a thermocompression bonding method 40 for bonding the die 200 to the substrate 300 according to the second embodiment of the invention.

At Step 401, the die 200 is transferred into the secondary container 120 and held by a die holding device 121 with a bump side of the die 200 facing downward such that organic contaminants on the bump side of the die 200 can be removed by the second plasma cleaning device 140.

Referring to FIG. 3B, the die 200 is held by the die holding device 121 such that the second plasma cleaning device 140 can discharge plasma towards the bump side of the die 200 to remove organic contaminants thereon.

At Step 402, the second plasma cleaning device 140 is operated to remove organic contaminants on the die 200. The active gas used by the second plasma cleaning device 140 includes oxygen.

At Step 403, the die 200 is transferred from the secondary container 120 to the main container 110 and is positioned at a first predetermined position by the transfer system 160A such that the die holding device 119 is operative to pick up the die 200 from the transfer system 160A.

Specifically, in this embodiment, after the die 200 is cleaned by the second plasma cleaning device 140, the die 200 is transferred and placed on the die feeder 162A by the die holding device 119 with the die's bump side in contact with the die feeder 162A. Then the die pick arm 163A picks up the die 200 from the die feeder 162A, and transfers the die 200 to the first pad P1 of the DTA 161A with the bump side of the die 200A being in contact with the first pad P1. The DTA 161A then moves the die 200A to the first predetermined position to allow the die holding device 119 is to pick up the die 200 from the DTA 161A with the bump side of the die 200 facing downward. After the die 200 is cleaned by the first plasma head 131, the die holding device 119 is further operated to place the die 200 on the second pad P2 of the DTA 161A. The DTA 161A is then operated to transfer the die 200 to a second predetermined position below the bond head 101 such that the bond head 101 is operative to pick up the die 200 from the DTA 161A and hold the die 200 during the subsequent bonding process. The first predetermined position may be directly below the die holding device 119 or directly above the first plasma head 131A.

It should be noted that the examples of the transfer systems 160 and 160A shown in FIG. 2B and FIG. 3B are only for illustration purposes, and not intended to limit the scope of the invention. In other embodiments, the transfer system 160 or 160A may include different devices and be arranged in different ways.

At Step 404, the first plasma head 131A is operative to remove metal oxides from the die 200.

In certain embodiments, the die holding device 119 may be moved to a position directly aligned with the first plasma head 131A before the first plasma head 131A is activated to clean the die 200.

At Step 405, the second plasma head 132 is operative to remove metal oxides from the substrate 300.

In this embodiment, the step of removing metal oxides from the substrate 300 is conducted after the step of removing metal oxides from the die 200. However, in other embodiments, the two steps may be conducted simultaneously, or the step of removing metal oxides from the substrate 300 may be conducted before the step of removing metal oxides from the die 200. The substrate 300 may further be cleaned by the second plasma head 132A at any time before the bonding process.

At Step 406, the die 200 is transferred to a bonding position directly below the bond head 101 by the die transfer system 160A and the bond head 101 is operated to pick up the die 200 from the die transfer system 160A.

At Step 407, the bond head 101 is operative to bond the die 200 to the substrate 300 in the main container.

Various modifications may be made to the above-described embodiments. In some embodiments, the bonding system may not include the secondary container for forming the second inert environment. In some embodiments, the bond head may be installed at a lower portion of the main container and the substrate may be held by a holding device mounted at an upper portion of the main container, and the functions of the first plasma cleaning device and the transfer device may be modified accordingly to perform the cleaning process in the main container. A different number of inert gas diffusers may be provided in the main container, the secondary container, the transfer passage therebetween or the input passage of the secondary container. In some embodiments, the transfer system may include different devices arranged in different ways depending on the arrangement of the first and the secondary containers and the devices therein. The first and second inert environments may be formed using the same inert gas or a mixture of different inert gases.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding system for bonding an electronic component to a base member during a thermocompression bonding process, the bonding system comprising:

a first container for forming a first inert gas environment where the base member is locatable during bonding of the electronic component, a first plasma cleaning device disposed in the first container and operative to clean the electronic component or clean both the electronic component and the base member by removing metal oxides but not organic contaminants therefrom, a second plasma cleaning device disposed in a second container different from the first container and operative to clean the electronic component by removing organic contaminants but not metal oxides therefrom, wherein the electronic component is sequentially conveyed from the second container to the first container, such that removal of organic contaminants and removal of metal oxides are performed in different containers and in different respective processes, and a bond head movably installed in the first container, the bond head being operative to bond the electronic component to the base member after the electronic component and the base member have been cleaned by the first plasma cleaning device.

2. The bonding system according to claim 1, wherein the first plasma cleaning device comprises a first plasma head that is arranged and operative to clean the electronic component and a second plasma head that is arranged and operative to clean the base member.

3. The bonding system according to claim 2, wherein at least one of the first and second plasma heads is attached to a motion table in the first container so as to be movable to a cleaning position in the first container to clean the electronic component and/or the base member.

4. The bonding system according to claim 3, wherein the bond head is further configured to hold the electronic component while the first plasma head is cleaning the electronic component.

5. The bonding system according to claim 3, wherein the first and second plasma heads are attached to the motion table such that when the first plasma head is moved to a first cleaning position where the first plasma head is aligned with the electronic component to clean the electronic component, the second plasma head is simultaneously moved to a second cleaning position where the second plasma head is aligned with the base member located in the first container to clean the base member.

6. The bonding system according to claim 2, wherein the first plasma head is fixedly mounted at a first cleaning position in the first container for cleaning the electronic component.

7. The bonding system according to claim 6, further comprising a holding device configured to hold the electronic component when the first plasma head is cleaning the electronic component, the holding device being positioned to be aligned with the first plasma head such that the first plasma head is operative to clean the electronic component held by the holding device at the first cleaning position.

8. The bonding system according to claim 7, further comprising a heating member for heating the electronic component when the first plasma head is cleaning the electronic component, the heating member being coupled to the holding element.

9. The bonding system according to claim 2, wherein the second plasma head is fixedly mounted at a second cleaning position in the first container for cleaning the base member.

10. The bonding system according to claim 1, further comprising a transfer system configured to transfer the electronic component that has been cleaned by the second plasma cleaning device to the first container and to position the electronic component inside the first container.

11. The bonding system according to claim 10, further comprising a second container for forming a second inert gas environment, wherein the second plasma cleaning device is located in the second container for cleaning the electronic component when the electronic component is conveyed to the second container.

12. The bonding system according to claim 11, wherein the first container and the second container are in commu-nication with each other through a transport passage for allowing the electronic component that has been cleaned by the second plasma cleaning device to be transferred from the second container to the first container through the transport passage.

13. The bonding system according to claim 12, further comprising a first inert gas diffuser installed on the transport passage to form a first fluid curtain in the transport passage for impeding fluid communication of gases between the first and second containers.

14. The bonding system according to claim 13, wherein the second container further comprises an input passage for conveying the electronic component into the second container through the input passage, and a second inert gas diffuser installed on the input passage to form a second fluid curtain in the input passage for impeding fluid communication of gases between the second container and an ambient environment outside the second container.

15. The bonding system according to claim 1, further comprising an inert gas sensor located in the first container for detecting a concentration of the first inert gas environment in the first container.

16. The bonding system according to claim 15, wherein the bond head is movably installed in an internal chamber located in the first container, and the inert gas sensor is installed on an internal wall inside the internal chamber.

17. The bonding system according to claim 1, further comprising a hydrogen sensor located in the first container for detecting a concentration of hydrogen in the first container.

18. The bonding system according to claim 1, further comprising an ozone sensor located on the second container for detecting leakage of ozone from the second container.

19. A bonding method for bonding an electronic component to a base member using a bonding system during a thermocompression bonding process, the bonding system comprising a bond head, a first plasma cleaning device and a second plasma cleaning device, the first plasma cleaning device being located in a first inert gas environment formed in a first container, and the second plasma cleaning device being located in a second container different from the first container, the method comprising:

cleaning the electronic component in the second container by removing organic contaminants but not metal oxides therefrom with the second plasma cleaning device disposed in the second container, conveying the electronic component that has been cleaned by removing organic contaminants but not metal oxides by the second plasma cleaning device from the second container to the first container, cleaning the electronic component or cleaning both the electronic component and the base member in the first container by removing metal oxides but not organic contaminants therefrom with the first plasma cleaning device disposed in the first container, and bonding the electronic component to the base member with the bond head.

* * * * *